US011223356B2

(12) United States Patent
Puchleitner et al.

(10) Patent No.: US 11,223,356 B2
(45) Date of Patent: Jan. 11, 2022

(54) DRIVER CIRCUIT FOR ANALYZING AND CONTROLLING A PIEZOELECTRIC COMPONENT, BUTTON PROVIDING HAPTIC FEEDBACK, AND OPERATING METHOD

(71) Applicant: TDK Electronics AG, Munich (DE)

(72) Inventors: Roman Puchleitner, St. Stefan (AT); Harald Kastl, Bad Gams (AT); Aditya Rajapurkar, Graz (AT); Daniel Neuwirth, Vilshofen (DE)

(73) Assignee: TDK Electronics AG, Munich (DE)

( * ) Notice: Subject to any disclaimer, the term of this patent is extended or adjusted under 35 U.S.C. 154(b) by 168 days.

(21) Appl. No.: 16/493,526

(22) PCT Filed: Mar. 16, 2018

(86) PCT No.: PCT/EP2018/056729
§ 371 (c)(1),
(2) Date: Sep. 12, 2019

(87) PCT Pub. No.: WO2018/172220
PCT Pub. Date: Sep. 27, 2018

(65) Prior Publication Data
US 2020/0007128 A1 Jan. 2, 2020

(51) Int. Cl.
*H03K 17/96* (2006.01)
*G06F 3/01* (2006.01)
(Continued)

(52) U.S. Cl.
CPC ........... *H03K 17/964* (2013.01); *G06F 3/016* (2013.01); *H01L 41/042* (2013.01);
(Continued)

(58) Field of Classification Search
CPC . H03F 3/2171; H03F 2200/78; H01L 41/042; G06F 3/016; H02M 3/33507; H03K 17/964; H03K 2217/96062
(Continued)

(56) References Cited

U.S. PATENT DOCUMENTS 4,994,955 A    2/1991  Schoofs et al.
5,953,218 A *  9/1999  Mukaihara ........ H02M 3/33507
                                              363/21.09
(Continued)

FOREIGN PATENT DOCUMENTS

DE    102004033125 A1    2/2006
DE    102015117262 A1    4/2017
(Continued)

*Primary Examiner* — Quan-Zhen Wang
*Assistant Examiner* — Mancil Littlejohn, Jr.
(74) *Attorney, Agent, or Firm* — Slater Matsil, LLP

(57) ABSTRACT

A driver circuit is disclosed. In an embodiment a drive circuit includes a signal port with a first terminal and a second terminal, a first node and a second node, a comparator with an inverting input, a non-inverting input and an output and an operational amplifier with an inverting input, a non-inverting input and an output, wherein the first terminal is electrically conductively connected with the inverting input of the operational amplifier, wherein the second terminal is electrically conductively connected with the non-inverting input of the comparator, wherein the inverting input of the comparator is electrically conductively connected with the output of the operational amplifier, wherein the first node is electrically conductively connected with the output of the operational amplifier, wherein the inverting input of the comparator is electrically conductively connected with the inverting input of the operational amplifier, and wherein the second node is electrically conductively connected with the non-inverting input of the operational amplifier.

20 Claims, 9 Drawing Sheets

(51) Int. Cl.
*H01L 41/04* (2006.01)
*H02M 3/335* (2006.01)
*H03F 3/217* (2006.01)

(52) U.S. Cl.
CPC ...... *H02M 3/33507* (2013.01); *H03F 3/2171* (2013.01); *H03F 2200/78* (2013.01); *H03K 2217/96062* (2013.01)

(58) Field of Classification Search
USPC ............................................ 340/407.1, 407.2
See application file for complete search history.

(56) References Cited

U.S. PATENT DOCUMENTS

| | | | |
|---|---|---|---|
| 5,982,304 A | 11/1999 | Selker et al. | |
| 6,222,351 B1 * | 4/2001 | Fontanella | H02M 3/07 323/222 |
| 6,400,096 B1 | 6/2002 | Wells et al. | |
| 8,605,053 B2 | 12/2013 | Murphy et al. | |
| 8,854,319 B1 | 10/2014 | Nickson et al. | |
| 9,785,237 B2 | 10/2017 | Shinozaki et al. | |
| 2002/0084721 A1 | 7/2002 | Walczak | |
| 2006/0028095 A1 * | 2/2006 | Maruyama | H03K 17/9643 310/316.01 |
| 2009/0146533 A1 | 6/2009 | Leskinen et al. | |
| 2010/0123521 A1 * | 5/2010 | Bach | H03F 3/45179 330/278 |
| 2012/0013220 A1 | 1/2012 | Kawata et al. | |
| 2018/0266849 A1 * | 9/2018 | Chen | G06F 3/016 |
| 2019/0067552 A1 | 2/2019 | Rinner | |

FOREIGN PATENT DOCUMENTS

| | | |
|---|---|---|
| EP | 2600224 A | 6/2013 |
| EP | 2763317 A2 | 8/2014 |
| EP | 3018824 A1 | 5/2016 |
| EP | 3065029 A1 | 9/2016 |
| EP | 2472365 B1 | 10/2016 |
| JP | H04138077 A | 5/1992 |
| JP | 2006107140 A | 4/2006 |
| JP | 2009169612 A | 7/2009 |
| JP | 2009245105 A | 10/2009 |
| JP | WO2013105518 A1 | 5/2015 |

\* cited by examiner

DRIVER CIRCUIT FOR ANALYZING AND CONTROLLING A PIEZOELECTRIC COMPONENT, BUTTON PROVIDING HAPTIC FEEDBACK, AND OPERATING METHOD

This patent application is a national phase filing under section 371 of PCT/EP2018/056729, filed Mar. 16, 2018, which claims the priority of German patent application 102017106188.6, filed Mar. 22, 2017, each of which is incorporated herein by reference in its entirety.

TECHNICAL FIELD

The invention relates to driver circuits for analyzing and controlling a piezoelectric device. The piezoelectric device, connected with a button or as part of a button, may supply a user with haptic feedback. The application further relates to such a button and to a method for operating such a button with haptic feedback.

BACKGROUND

Buttons with short travel support the trend towards miniaturization. The shorter a button's travel is, the less the button contributes to the structural height or thickness of an electrical device in which the button is installed.

As travel diminishes, so the haptic impression made on actuation of the button also changes. To make the usual impression on a user when a button is actuated, it is possible to provide the button with an actuator which is connected mechanically with the surface of the button and effects movement of the button's surface. This also makes it possible to indicate to the user that actuation of the button has indeed taken place, e.g., in the case of a relatively smooth surface of uniform feel.

Circuits which are provided to respond to user input are known, for example, from U.S. Pat. No. 8,605,053 B2.

Sensor circuits with a piezoelectric device are known from European Patent No. EP 3,018,824 A1.

Electrical circuits with piezoelectric elements are likewise known from European Patent No. EP 3,065,029 A1 and from European Patent No. EP 2,600,224 A1 as well as from European Patent No. EP 2,472,365 B1.

SUMMARY OF THE INVENTION

Embodiments provide buttons with haptic feedback which are capable of imparting additional information, use less energy and are less susceptible to defects. For this purpose, novel circuits are needed for initiating activation states and for controlling such switches, as are methods for controlling the mechanical elements of the switches.

Embodiments provide a driver circuit. The driver circuit comprises a signal port with a first terminal and a second terminal. The circuit additionally has a first node and a second node. Moreover, the driver circuit has a comparator with an inverting input, a non-inverting input and an output. Furthermore, the driver circuit has an operational amplifier with an inverting input, a non-inverting input and an output. The first terminal is electrically conductively connected with the inverting input of the operational amplifier. The second terminal is electrically conductively connected with the non-inverting input of the comparator. The inverting input of the comparator is electrically conductively connected with the output of the operational amplifier. The first node is electrically conductively connected with the output of the operational amplifier. The inverting input of the comparator is electrically conductively connected with the inverting input of the operational amplifier. The second node is electrically conductively connected with the non-inverting input of the operational amplifier.

The signal port is intended to be electrically conductively connected with a piezoelectric device. To this end, the first terminal of the signal port may be connected with a first electrode of the piezoelectric device. The second terminal of the signal port may be connected with a second electrode of the piezoelectric device.

The piezoelectric device may have a stacked structure with a main body consisting of a piezoelectric material and patterned electrode surfaces in metallization layers, with layers of the piezoelectric material and layers of the electrode surfaces each being arranged alternately. The electrode surfaces are here each electrically conductively connected with one of two external electrodes. At the top and/or bottom thereof, the stack may have a "roof". Depending on the electrical voltage applied to the external electrodes of the piezoelectric device, the stack of layers has a different height and a different width. That is to say, if the voltage applied is varied, a change in length is induced, which is amplified by the roof in the manner of a lever.

If the piezoelectric device experiences a pressure in the stack direction (due to the button being pressed, on the inside of which the layer stack is mounted), the change in voltage induced at the electrodes by an associated change in length of the layer stack is a measure of the force with which the button is being pressed. If the piezoelectric device experiences a pressure via the roof, the device is extended. The change in voltage induced by the associated extension of the stack is a measure of the force with which the button is being pressed.

The travel in the event of active or passive actuation of the button may in this case be of the order of magnitude of a few 100 μm, e.g., at most a few 100 μm, and is thus relatively short for button travel.

The induced change in voltage, which is a measure of the force acting on the button, may be read out. In response thereto, a voltage pulse or a voltage signal may in turn be output to the piezoelectric element in order to effect mechanical movement of the button. Such haptic feedback informs the user that he or she has successfully actuated the button.

The above-stated driver circuit has the advantage of managing on the one hand with relatively few circuit components. At the same time, the indicated driver circuit allows the pressure acting on the button to be read out and driver-side activation of the piezoelectric device to bring about haptic feedback. The change in voltage applied to the piezoelectric device may thus simultaneously be both read out and open- or closed-loop controlled.

The relatively small number of circuit components which may be interconnected in the driver circuit reduces the risk of driver circuit failure. The service life of the driver circuit is thus increased.

Furthermore, the driver circuit makes it possible for electrical energy provided to activate the piezoelectric device to be reutilized. Energy consumption is thereby reduced compared with circuits known hitherto and which for instance occur at driver end stages with linear controllers.

The driver circuit makes it possible to control closed-loop control) or regulate (open-loop control) the piezoelectric device with regard to a signal shape, i.e., the voltage characteristic over time, transmitted to the device, and with regard to the magnitude of the output voltage to the device in such a way that the device reliably gives a feedback signal as soon as an output voltage is generated by the piezoelectric device as a result of pressure. The signal shape is freely configurable subject to compliance with given edge times.

A voltage signal generated on pressing or releasing the piezoelectric device or a change in voltage is fed to the operational amplifier and processed appropriately thereby, so that the signal can be analyzed, e.g., by a microcontroller.

The operational amplifier further processes a specified signal (target specification) of a microcontroller in such a way that it may be fed to the comparator.

For signals from the operational amplifier to a microcontroller, the operational amplifier may be connected via an analog/digital converter (ADC). For signals from the microcontroller to the operational amplifier, the microcontroller or an output of the microcontroller may be connected via a digital/analog converter (DAC).

An electrical signal, e.g., a current signal, may be measured at the piezoelectric device, e.g., via a low-ohmic resistor, and fed to the comparator. This signal is compared with the signal output of the operational amplifier. If the component current to the piezoelectric device and thus the voltage at the piezoelectric device is fallen below, countermeasures are taken via the comparator, which may control a further circuit element, e.g., a half-bridge. The half-bridge may in this case control further circuit elements, e.g., transistors. In this way, it is possible to increase the voltage applied to the piezoelectric device, if it is too low relative to a setpoint value. Conversely, the voltage may be reduced if it is too low relative to a currently set comparison value.

The operational amplifier may, to this end, have a feedback loop.

It is possible for a signal to be output at the piezoelectric device if pressing of a button is detected. Alternatively or in addition, pressure on the piezoelectric device may also switch a free output at the microcontroller.

It is thus possible for the driver circuit additionally to comprise a half-bridge. Moreover, the driver circuit may have a third node, a fourth node and a fifth node. It is moreover possible for the driver circuit to have a first transistor and a second transistor, a first diode and a second diode and a capacitor. The half-bridge is electrically conductively connected with the first terminal, with the first transistor, with the second transistor and with the output of the comparator and with the fourth node and with the fifth node. The first diode is electrically conductively connected with the first terminal and the capacitor. The second diode is electrically conductively connected with the first terminal. The first transistor is electrically conductively connected with the first terminal and the third node. The second transistor is electrically conductively connected with the first terminal and the third node.

The third node may constitute a supply terminal of the driver circuit or be electrically conductively connected with a supply circuit for the driver circuit. The capacitor serves to store electrical energy temporarily. The first transistor and the second transistor or the first diode and the second diode serve to control the signal port, to which the piezoelectric device may be connected. If the component current of the piezoelectric device and thus the voltage at the piezoelectric device is fallen below, the half-bridge, which in turn controls the first transistor and the second transistor, is controlled via the comparator. If the first transistor is closed and the second transistor open, then voltage is supplied if the voltage at the piezoelectric device is too low. If the first transistor is open and the second transistor closed, then the signal port is supplied with electrical power, e.g., if the voltage at the signal port is not too low. The energy supply to the signal port SP may be passed via a coil, to smooth the current or voltage characteristics.

The coil may in this case be interconnected in series between the half-bridge and the first terminal of the signal port.

Inclusion of the half-bridge results in a switching controller, which is controlled by the comparator and via which the piezoelectric device or the signal port is supplied with a desired voltage. The switching controller also ensures that, on discharge of the piezoelectric device, i.e., in the event of a falling voltage (falling edge) present at the signal port, the energy is fed to the capacitor. This energy is removed again during the next charging cycle of the piezoelectric device (rising edge: increasing voltage at the signal port).

It is possible for the driver circuit additionally to comprise a microcontroller, an A/D converter, a D/A converter, a voltage converter and the piezoelectric device. The first node is electrically conductively connected with the microcontroller via the A/D converter. The second node is electrically conductively connected with the microcontroller via the D/A converter. The fourth node is electrically conductively connected with the microcontroller. The fifth node is electrically conductively connected with the microcontroller. The third node is electrically conductively connected with a supply terminal via the voltage converter. The signal port is electrically conductively connected with the piezoelectric device.

One object of the operational amplifier is to process a specified signal (target specification) from the microcontroller, provided via the D/A converter, in such a way that the signal may be fed to the comparator, which regulates the half-bridge of the switching controller. The signal from the D/A converter predetermines the signal shape for the output signal to the signal port. At the same time, the voltage is measured at the signal port and fed to the operational amplifier via a high-ohmic resistance divider. In this way, in a feedback loop the specified signal is compared with the actual voltage at the signal port and optionally corrected.

It is possible that the piezoelectric device is part of a switch with haptic feedback. In this case, pressing of the button may be registered by analysis of a voltage present at the piezoelectric device. The haptic feedback may be produced by applying a voltage to the piezoelectric device. Alternatively or in addition, one or more outputs of the microcontroller may be switched.

It is accordingly possible for the driver circuit additionally to have a voltage divider between the signal port and the comparator and/or a voltage divider between the signal port and the operational amplifier.

Activation voltages for piezoelectric devices in the form of piezoelectric actuators may be of the order of magnitude of around at most a few wo volts, e.g., 100 volts. Such voltages might destroy electrical devices such as comparators, operational amplifiers, half-bridges and transistors. Voltage dividers, e.g., in the form of high-ohmic resistance dividers, between the signal port and the sensitive devices reduce the voltage level for the sensitive devices. While the signal from the D/A converter predetermines the signal shape for the output signal at the signal port, the voltage is measured at the signal port and therefore fed via the high-ohmic resistance divider to the operational amplifier in a feedback loop. The resistance divider thus ensures that the voltage at the operational amplifier and subsequently at the microcontroller is reduced to a safe level, e.g., of 5 volts or less, to protect the low-voltage part of the circuit.

The circuit may have a low-ohmic resistor at the signal port. By way of the low-ohmic resistor, the current signal at the signal port is measured and fed to the comparator.

The advantage of such a driver circuit lies in the fact that control of the signal port is performed by means of a switching controller. This ensures that only the momentarily required energy is fed to the signal port during the rising edge. On discharge of the device connected to the signal port (falling edge), the transistors of the switching controller are switched such that the charging energy is fed to a capacitor and is available again during the next charging cycle. In contrast to conventional circuit designs, surplus energy is no longer dissipated. The efficiency of the driver circuit is improved and the components of the driver circuit do not have to be designed for relatively high currents and electrical powers. Moreover, on discharge, the electrical charge is not diverted to ground in order to bring about steep edges. The discharge edge is thus regulated. Short-circuiting of the signal port is prevented, in order to achieve better electromagnetic compatibility.

It is thus possible for a voltage at the signal port to be adjustable by switching controller. The voltage to be adjusted by the switching controller may in this case be a signal with amplitude varying over time. Both on actuation of the switch and on release of the switch, it is thus possible for any desired movement pattern, e.g., vibration pattern, to be generated by the piezoelectric device. The signal shape may in this case be stored in the microcontroller.

It is accordingly possible for the comparator to be embodied by an operational amplifier without feedback. Such comparators may be produced with relatively little design effort and satisfy the requirements of the driver circuit.

It is possible for the comparator to be produced with adjustable hysteresis.

It is possible for the voltage supply of at least one operational amplifier to be implemented with a series regulator. The microcontroller and the comparator may also be embodied by the voltage supply with the series regulator or an additional voltage supply with an additional series regulator. Series regulators in principle ensure good signal smoothness.

To generate the supply voltage of the signal port, a "step up" converter or a charging pump may be used. The supply voltage for the entire driver circuit may amount to 12 volts and be made available, for example, from the vehicle electrical system of a motor vehicle. The supply voltage in this case generates the voltage level of 100 volts or more for the signal port.

It is possible for the driver circuit to comprise a high-ohmic voltage divider, via which the voltage present at the signal port is fed to the operational amplifier.

It is possible for the signal port to be controlled by the comparator via a switching controller and supplied with a predetermined voltage, wherein the predetermined voltage is stored in a microcontroller.

It is possible for the driver circuit to comprise a coil, which is electrically conductively connected to the first terminal and which smooths the electrical signal to the signal port.

It is possible for the signal port to be activatable by triggering one or more digital inputs of a microcontroller.

It is possible in this respect for said triggering to be initiated by a touch sensor.

The touch sensor may in this respect be part of the driver circuit. The touch sensor may in this respect also be part of an external circuit environment with which the driver circuit is electrically conductively connected.

It is possible for the driver circuit to comprise a resistive element, which is interconnected between the inverting input of the comparator and the inverting input of the operational amplifier. Furthermore, the driver circuit may comprise a series interconnection with a resistive element and a capacitive element. This series interconnection may be interconnected in parallel with the resistive element and thus likewise between the inverting input of the comparator and the inverting input of the operational amplifier. It is possible in this respect for the capacitive element to be interconnected between the comparator and the resistive element of the series interconnection.

The resistive element of the series interconnection may have a resistance of from 80 kΩ to 160 kΩ, for example, 120 kΩ. The resistive element interconnected in parallel with the series interconnection may have a resistance of from 180 kΩ to 260 kΩ, e.g., 220 kΩ. The capacitive element of the series interconnection may have a capacitance of from 5 nF to 15 nF, for example, 10 nF.

Provision of the series interconnection or provision of the parallel connection consisting of the resistive element and the series interconnection improves the control behavior and thus the signal quality of the signal which can be provided at the signal port SP.

A further resistive element, for example, with a resistance of 3 kΩ, may be interconnected between the inverting input of the comparator and the series interconnection.

Embodiments provide a button. A button with haptic feedback comprises a piezoelectric device and a driver circuit. The driver circuit may be configured, for example, as indicated above. The driver circuit is provided to register a change in voltage induced by the piezoelectric device and to apply a voltage to the piezoelectric device on pressing and/or release of the button.

It is additionally possible for an output to be switched at the microcontroller on pressing and/or release of the button or of the piezoelectric device.

Embodiments provide a method for operating a button. A method for operating a button with haptic feedback comprises the steps of: —registering a change in voltage induced by a piezoelectric device, —activating the piezoelectric device by application of a voltage, if the voltage induced by the piezoelectric device rises or falls.

In addition or as an alternative to activation, it is possible for an output of a microcontroller to be switched on registration of a change in voltage at the piezoelectric device.

It is possible, with the method, for some of the energy to be recovered on activation of the piezoelectric device.

It is possible for registration of the change in voltage to include analysis of a change over time in a voltage at the electrical device and/or analysis of a voltage gradient.

It is possible for the method to comprise one or more of the following steps on initialization of a driver circuit by a microcontroller: ascertaining, —whether a component is connected to a signal port, —the magnitude of the capacitance of a circuit component connected to a signal port, and/or—the magnitude of the resonant frequency of a circuit component connected to a signal port.

The method may accordingly be carried out with at least partial use of the above-described driver circuit. The circuit component may accordingly be a piezoelectric device with a capacitance and a resonant frequency.

Ascertainment may proceed using a signal of constant or variable frequency at the signal port. The shape of the signal, e.g., a square wave signal, may be stored in the microcontroller. In order to determine the resonant frequency, the frequency-dependent current flow to the signal port may be determined. If the resonant frequency is determined by measuring or by reading out a stored value in the microcontroller, the signal port may be controlled with an adjusted, e.g., an optimized, frequency.

One of the above-stated electrically conductive connections between different circuit components of the driver circuit may in this respect be a direct electrical interconnection or an interconnection via series-interconnected further circuit elements such as, for example, capacitors, coils or ohmic resistors. For instance, the comparator and the operational amplifier are interconnected electrically conductively with the signal port. Due to the markedly different voltage levels of the operating voltages of these components, it is preferable to integrate voltage dividers into the electrical connection in order to obtain different voltage levels for the different devices.

BRIEF DESCRIPTION OF THE DRAWINGS

Central aspects of the driver circuit, technical details and individual features of exemplary embodiments are shown in the schematic figures, in which.

DETAILED DESCRIPTION OF ILLUSTRATIVE EMBODIMENTS

Figure 1:
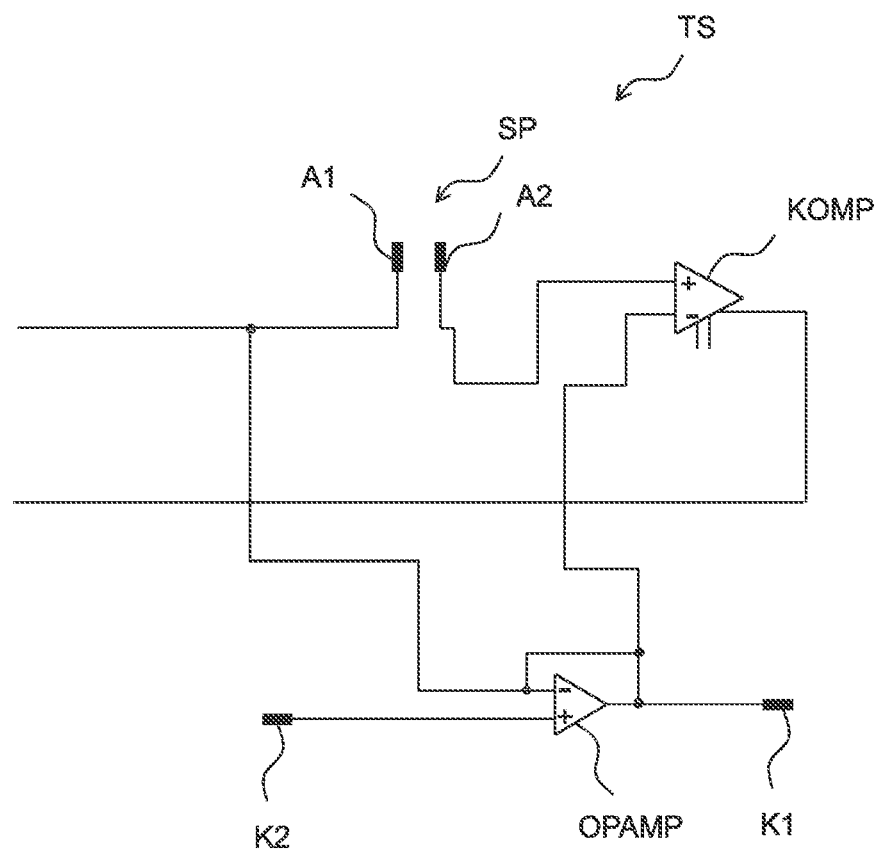
FIG. 1 shows an equivalent circuit diagram for the driver circuit with important circuit components of a simple embodiment.

FIG. 1 shows the relative circuit arrangement of individual circuit components of the driver circuit TS in an equivalent circuit diagram. The driver circuit TS has a signal port SP with a first terminal A1 and a second terminal A2. Furthermore, the driver circuit TS has a comparator KOMP and an operational amplifier OPAMP. The driver circuit moreover has a first node K1 and a second node K2. The comparator KOMP has a non-inverting input (+) and an inverting input (−). The operational amplifier OPAMP has an inverting input (−) and a non-inverting input (+). The output of the operational amplifier OPAMP is interconnected with the first node K1. The output and/or the first node K1 is/are interconnected via a feedback with the non-inverting input of the operational amplifier. This inverting input of the operational amplifier is interconnected with the first terminal A1 of the signal port SP. The non-inverting input of the operational amplifier is interconnected with the second node K2. The comparator is additionally interconnected with a signal line, so enabling a control loop with a half-bridge of a switching controller.

The interconnection shown in FIG. 1 of signal port SP, comparator KOMP and operational amplifier OPAMP makes it possible, with a small number of circuit components, to detect changes in voltage at the signal port and at the same time to supply the signal port with a desired change in voltage. The electrodes of a piezoelectric device may be connected to the signal port SP. The piezoelectric device may be connected with the surface of a button to be actuated. This makes it simultaneously possible to determine pressing of the button and to give haptic feedback to the button and/or to switch an output of a microcontroller.

Figure 2:
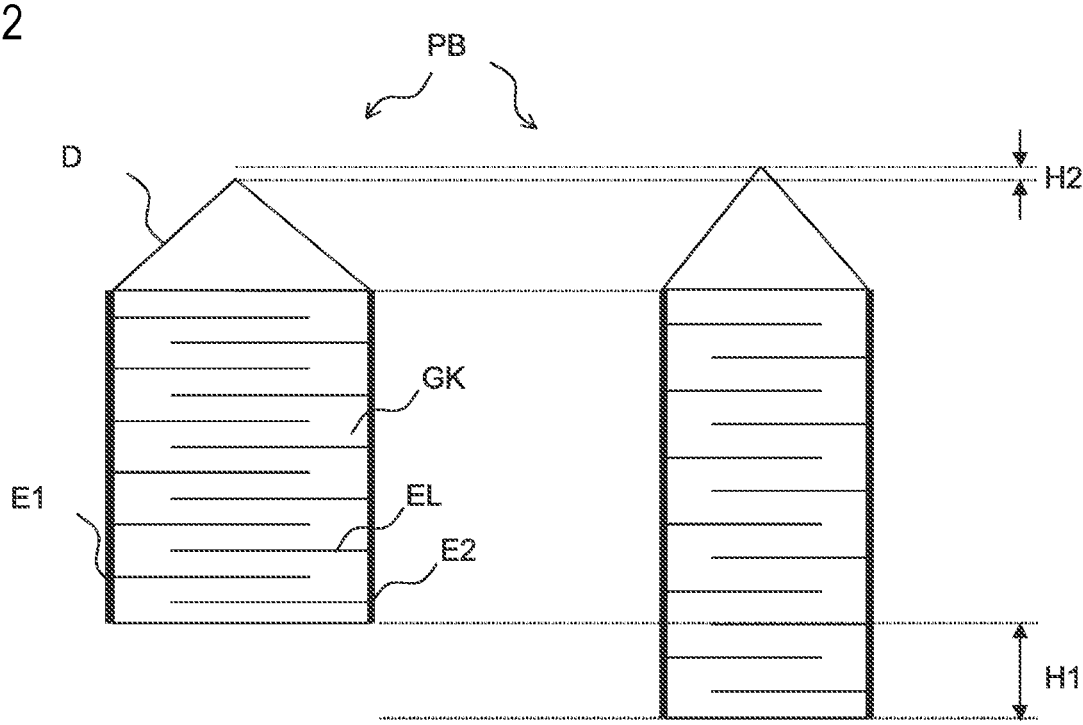
FIG. 2 shows the operating principle of a piezoelectric (stacked) device.

FIG. 2 illustrates the operating principle of a piezoelectric device in the form of a piezoelectric actuator. The piezoelectric device PB has a main body GK of a piezoelectric material. Electrode layers EL and piezoelectric material are layered alternately one on top of the other. Neighboring electrode layers are each connected alternately with one of two external electrodes E1, E2. A "roof" D is arranged at the top of the layer stack and has at least two elements of invariable length. The angle between the elements on the one hand and the top of the layer stack on the other is variable. The angle between the two elements themselves is also variable. If the voltage present between the two electrodes E1, E2 changes, the layer stack changes shape as a result of the piezoelectric effect. This makes it possible for the layer stack to contract horizontally and expand vertically. Vertical expansion brings about a travel H1. Horizontal contraction brings about a second travel H2 due to a change in the orientation of the elements of the roof D. The total travel H of the piezoelectric device PB is made up of these two components: H=H1+H2.

The total travel H may in this respect be of an order of magnitude of a few 100 µm, e.g., 100 µm or 200 µm. The vertical height of the piezoelectric device may likewise be of the order of magnitude of several 100 µm.

If the piezoelectric device experiences a pressure via the roof, the device is extended. The change in voltage induced by the associated extension of the stack is a measure of the force with which the button is being pressed.

Figure 3:
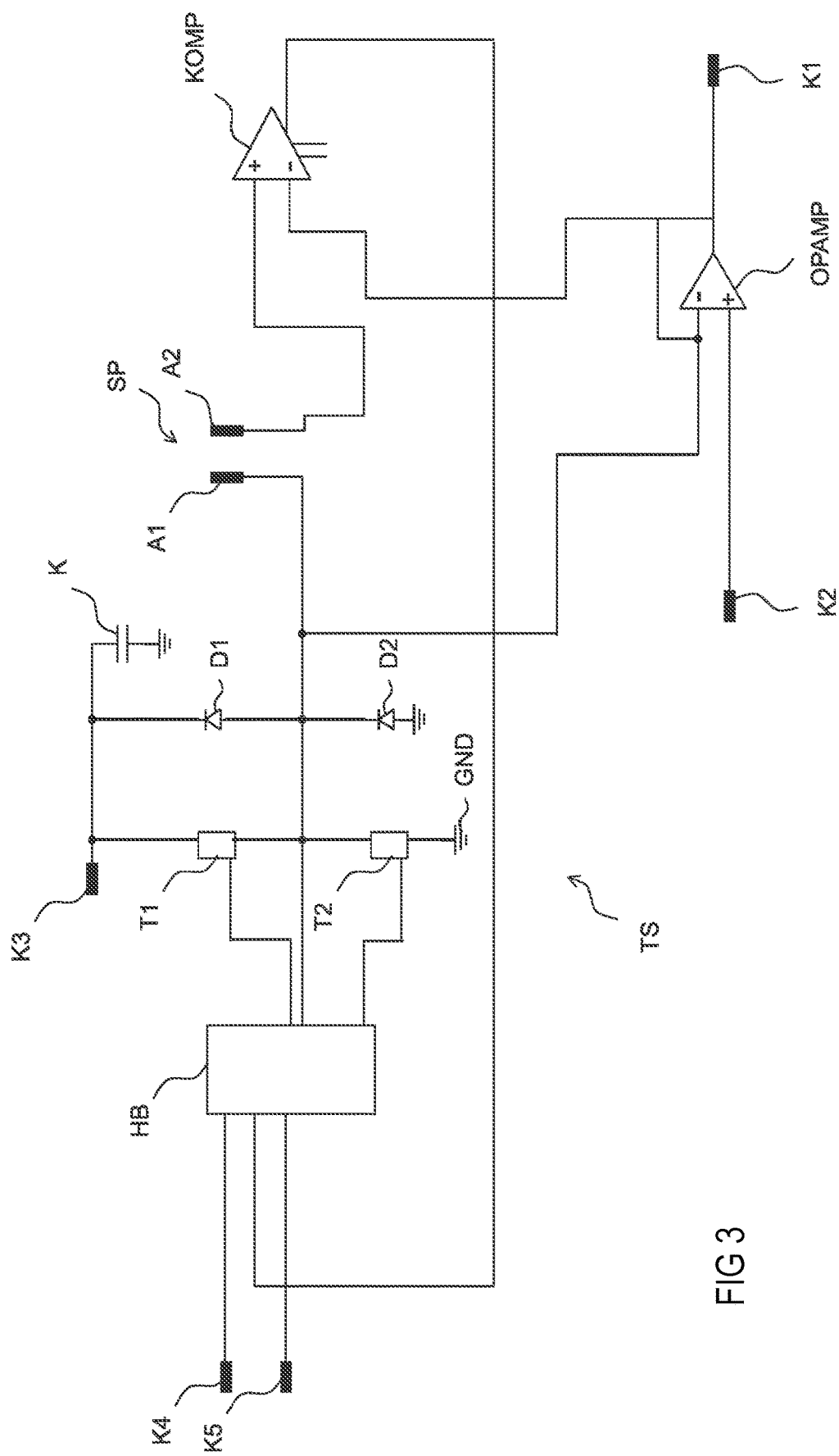
FIG. 3 shows an equivalent circuit diagram with additional circuit components.

FIG. 3 shows an equivalent circuit diagram with additional circuit components. The driver circuit has a third node K3, a fourth node K4 and a fifth node K5. Furthermore, the driver circuit has a half-bridge HB, a first transistor T1 and a second transistor T2. Moreover, the driver circuit has a capacitor K, a first diode D1 and a second diode D2.

The third node K3 serves to feed in a supply voltage for the signal port SP. The supply voltage may in this case be supplied directly to the third node K3. To this end, a voltage supplier for voltages in the range of a few 100 volts may be connected to the third node K3. The first transistor T1 is interconnected with the half-bridge HB, the third node K3 and the first terminal A1. The terminal of the first transistor T1 via which the first transistor is interconnected with the half-bridge HB makes it possible either to connect together conductively or to isolate from one another the terminals of the first transistor which are interconnected respectively with the third node K3 or with the first terminal A1. Likewise, the second transistor T2 makes it possible, via the connection to the half-bridge HB, either to connect conductively together or to isolate ground GND and the first terminal A1. The first diode D1 between the first terminal A1 and the capacitor K and the second diode D2 between the first terminal A1 and ground together make possible, with the two transistors T1, T2 controlled by the half-bridge HB, to activate a device connected to the signal port SP. Activation is possible in that electrical charge transmitted to the signal port may be temporarily stored at least in part in the capacitor K and is thereby again available for subsequent, later activation.

Via the fourth node K4 and the fifth node K5 and optionally via further additional nodes present, which are interconnected with the half-bridge HB, coupling of the half-bridge HB to a microcontroller is possible. The microcontroller may in this case predetermine a preferred voltage or a preferred voltage characteristic for activation of the signal port SP, which is efficiently converted by the half-bridge HB as part of the switching controller.

The fourth node K4 may in this respect provide a supply voltage—for example, of the magnitude of 12 V—for the half-bridge driver or be interconnected with a corresponding voltage supply.

The comparator KOMP is likewise electrically conductively connected with the half-bridge HB.

Figure 4:
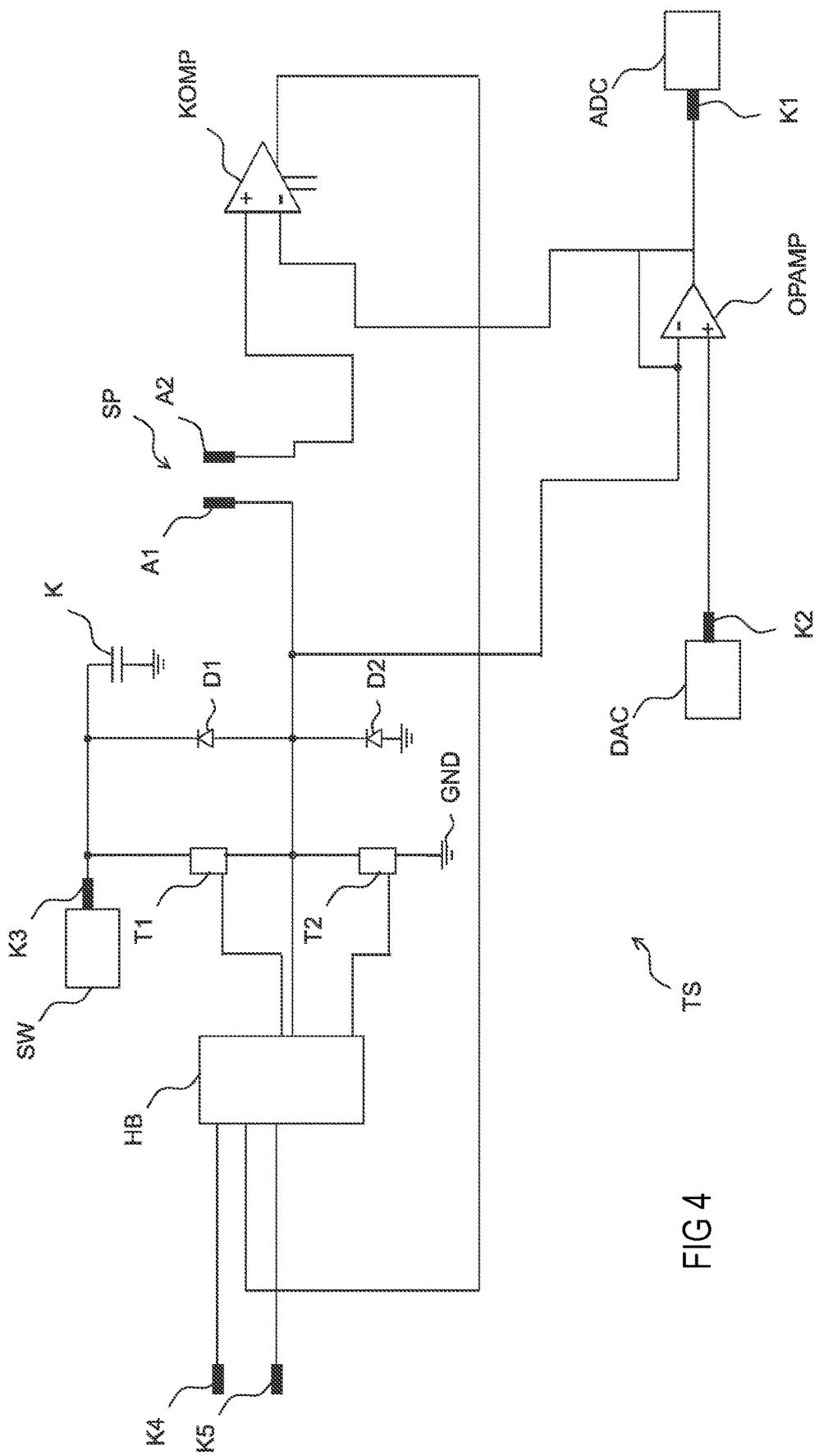
FIG. 4 shows an equivalent circuit diagram with further circuit components.

FIG. 4 shows an equivalent circuit diagram of the driver circuit, in which the first node K1 is coupled to an A/D converter ADC. The second node K2 is coupled to a D/A converter. The first node K1 is connected to a microcontroller via the A/D converter ADC. The second node K2 is connected to the microcontroller via the D/A converter DAC. The two converters ADC, DAC serve in this respect to convert between the analog domain as shown in FIG. 4 and the digital domain of the microcontroller.

The voltage converter SW supplies the third node K3 and thus, depending on transistor switch positions, the signal port SP with the relatively high supply voltage needed therefor.

Figure 5:
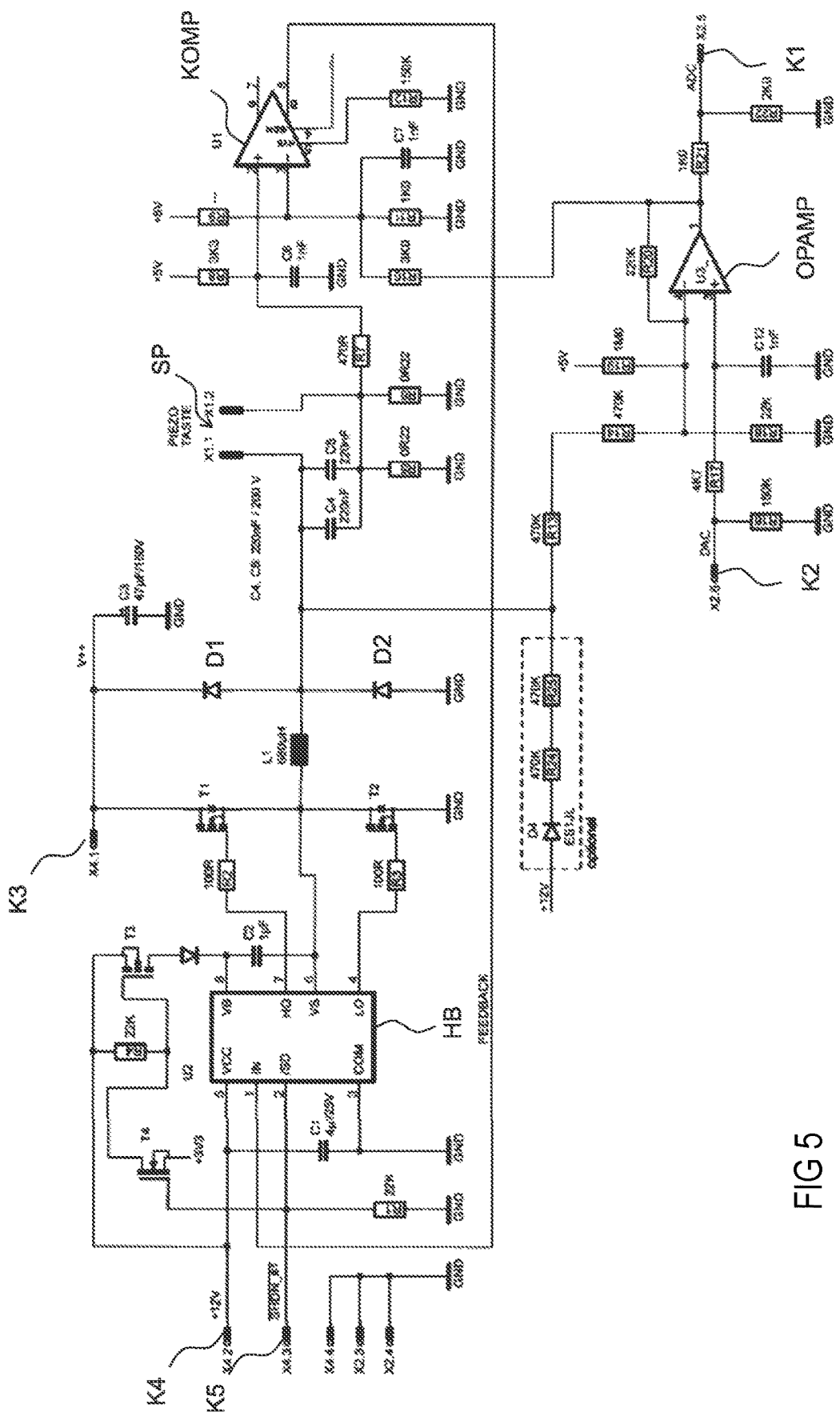
FIG. 5 shows an equivalent circuit diagram with additional circuit elements of an advantageous configuration of the driver circuit.

FIG. 5 shows the equivalent circuit diagram of a driver circuit in which additional circuit elements are present. The resistors R13, R14 and R18 form a voltage divider, in order to reduce the relatively high voltage of the signal port SP to a voltage level which is compatible with an operating voltage of the operational amplifier OPAMP. The resistor R7 correspondingly protects the non-inverting input of the comparator. The resistor R10 and the resistors R21, R22 likewise constitute a voltage divider.

A transistor T4 and a transistor T3 are electrically conductively connected with the fourth node and the fifth node respectively. The coil L1 between the half-bridge HB and the signal port serves to smooth a current or voltage signal. A capacitive element and a further diode are interconnected in series between the coil L1 and the third transistor T3. In this respect, the further diode is interconnected between the capacitive element and the third transistor T3. A resistor is interconnected between a terminal of the fourth transistor T4 and the fourth port K4. An electrical resistor is interconnected between the half-bridge HB and the first transistor T1. An electrical resistor is also interconnected between the second transistor T2 and the half-bridge.

The coil L1 forms a low-pass filter with the capacitive elements C4, C5 and the capacitor of the piezoelectric device.

Terminals ADC_#1 to ADC_#5 are the inputs of the analog/digital converter at the microcontroller. These are interconnected with the first node K1 of the driver circuit and serve to read in the feedback signals at the microcontroller. More or fewer analog/digital converters may also be used. This depends on how many driver circuits are controlled by the microcontroller. The A/DC signal is connected with the first node K1 of the driver circuit.

The digital/analog converter (DAC) of the microcontroller serves to predetermine the shape of the signal at the piezoelectric device. This signal shape is stored in the microcontroller and freely configurable. This D/AC output is connected via the non-inverting amplifier (see, for example, FIG. 7) with the second node K2 of the driver circuit. Further digital outputs are located at the microcontroller. These may switch the output, for example, in the event of a trigger, initiated by the piezoelectric device. The microcontroller also has digital inputs. Triggering for the driver circuit may thus be external.

Figure 6:
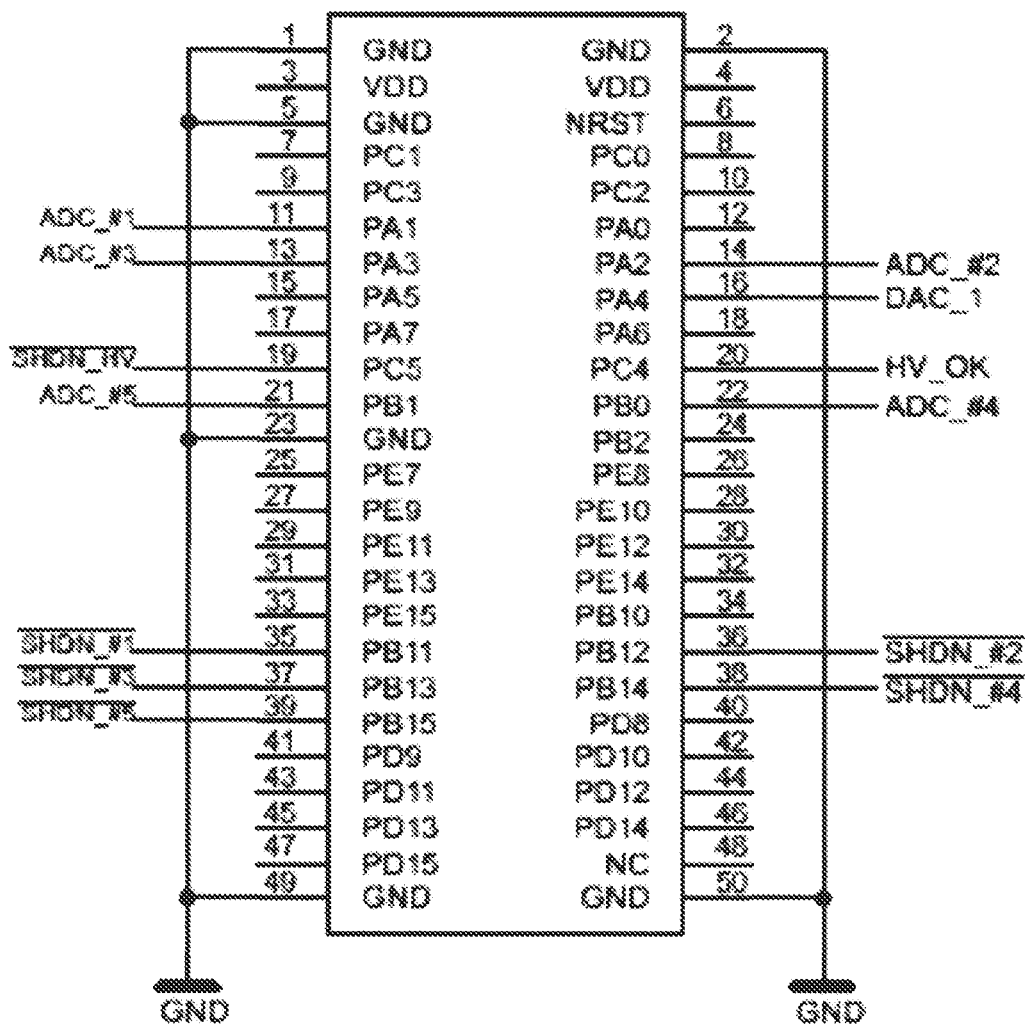
FIG. 6 shows a possible terminal assignment of a microcontroller.

FIG. 6 shows a possible assignment of the terminal pins of a microcontroller, which may be used for open- and closed-loop control of the other circuit elements of the driver circuit. The terminals ADC_#1 and ADC_#3 are interconnected with the first and second nodes respectively of the driver circuit.

Figure 7:
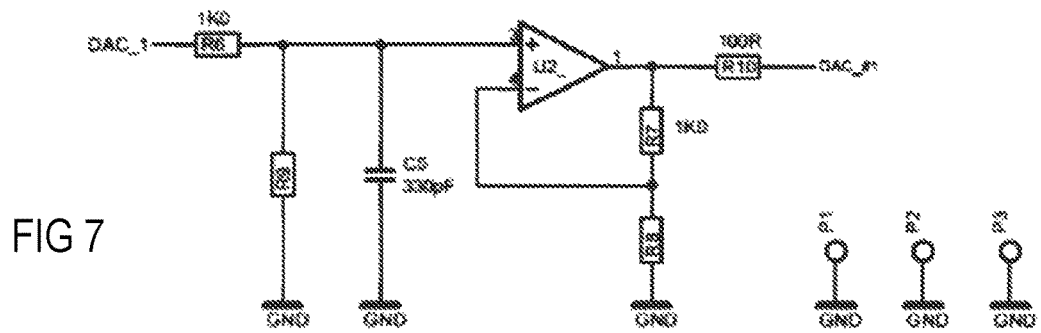
FIG. 7 shows an equivalent circuit diagram with circuit components at the output of a D/A converter.

FIG. 7 shows circuit components at the signal output of a possible D/A converter. The output of the converter has an operational amplifier with a feedback loop. The DAC signal is adapted by the microcontroller with the non-inverting amplifier.

Figure 8:
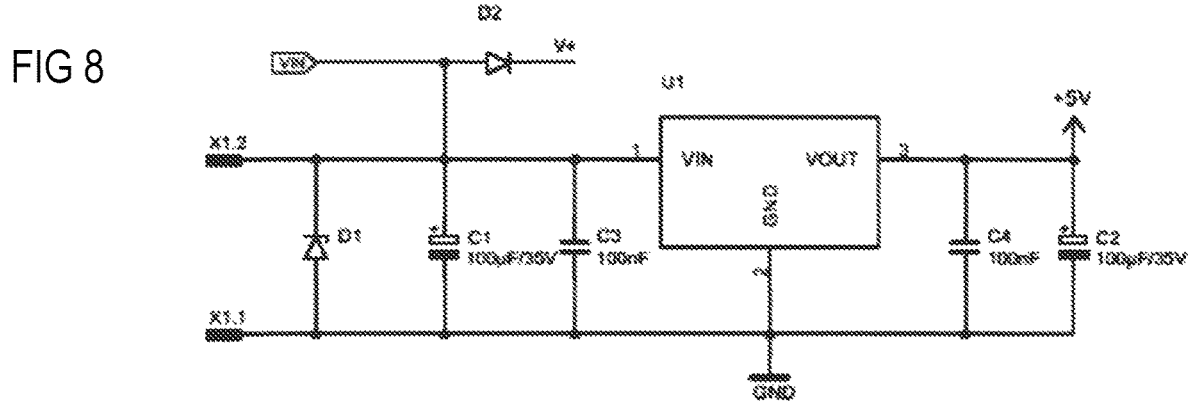
FIG. 8 shows an equivalent circuit diagram with circuit components of a voltage supply for a 5 volt supply voltage.

FIG. 8 shows circuit components of a possible voltage supply for a 5 volt voltage level, e.g., as voltage supplier for the operational amplifier or the comparator.

Figure 9:
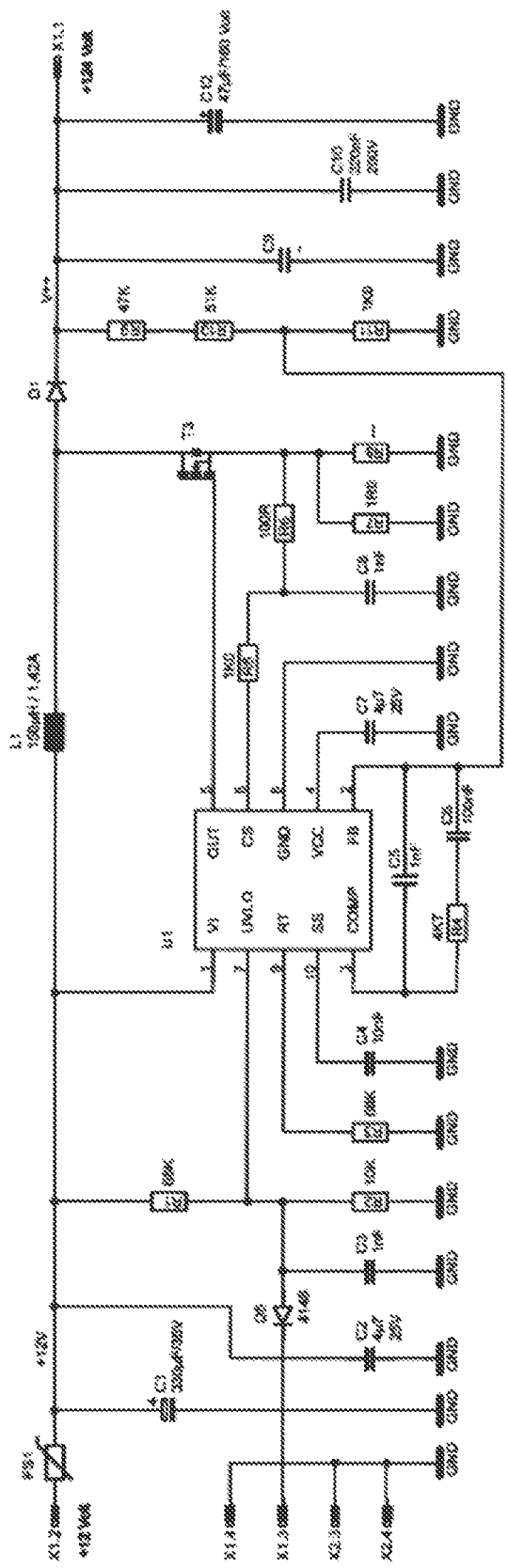
FIG. 9 shows an equivalent circuit diagram with circuit components of a possible supply voltage for the signal port.

In comparison thereto, FIG. 9 shows circuit components of a voltage supplier of somewhat more complex design, which is intended to supply the signal port SP with a relatively high activation voltage.

Figure 10:
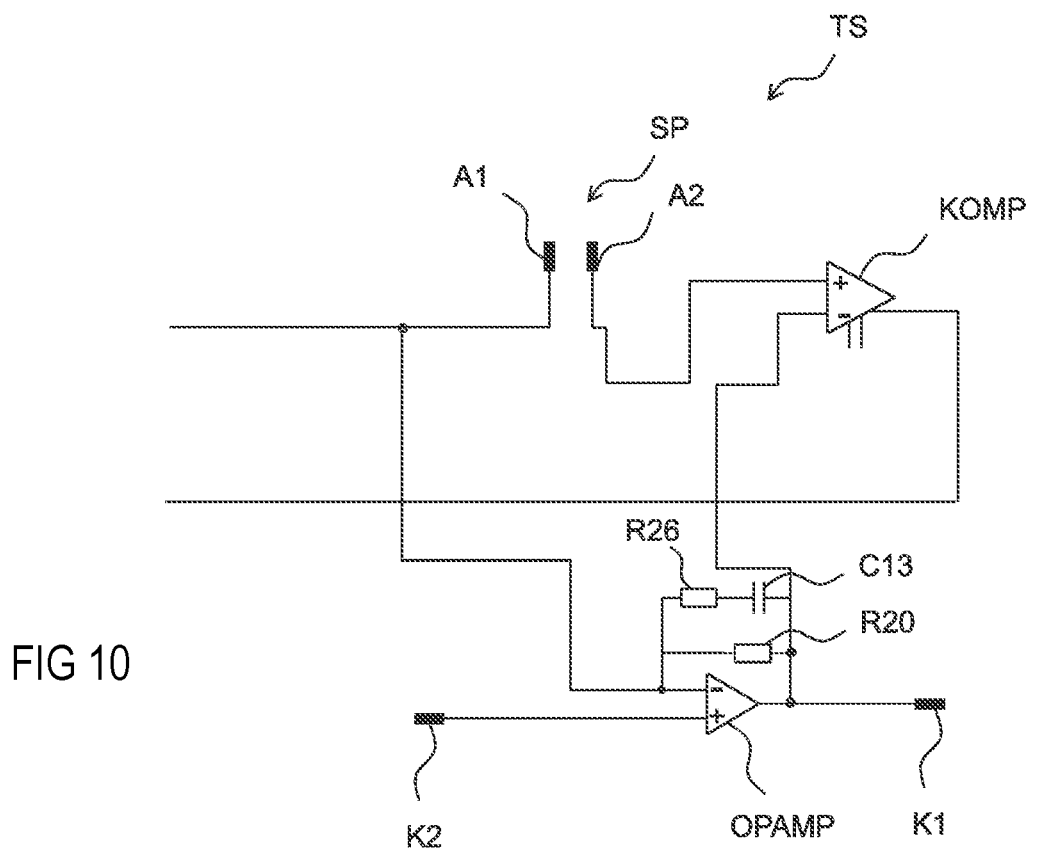
FIG. 10 shows an equivalent circuit diagram of the driver circuit with further circuit components.

FIG. 10 shows a driver circuit which, when compared with the circuit of FIG. 1, also has a resistive element R20, a resistive element R26 and a capacitive element C13. The resistive element R20 is interconnected between the inverting input of the comparator KOMP and the inverting input of the operational amplifier OPAMP. The resistive element R26 is interconnected in series relative to the capacitive element C13. The series interconnection of R26 and C13 is interconnected in parallel with the resistive element and between the inverting input of the comparator and the inverting input of the operational amplifier.

Provision of the series interconnection of resistive element R26 and capacitive element C13 improves control behavior and thus the signal quality of the signal which may be provided at the signal port SP.

Figure 11:
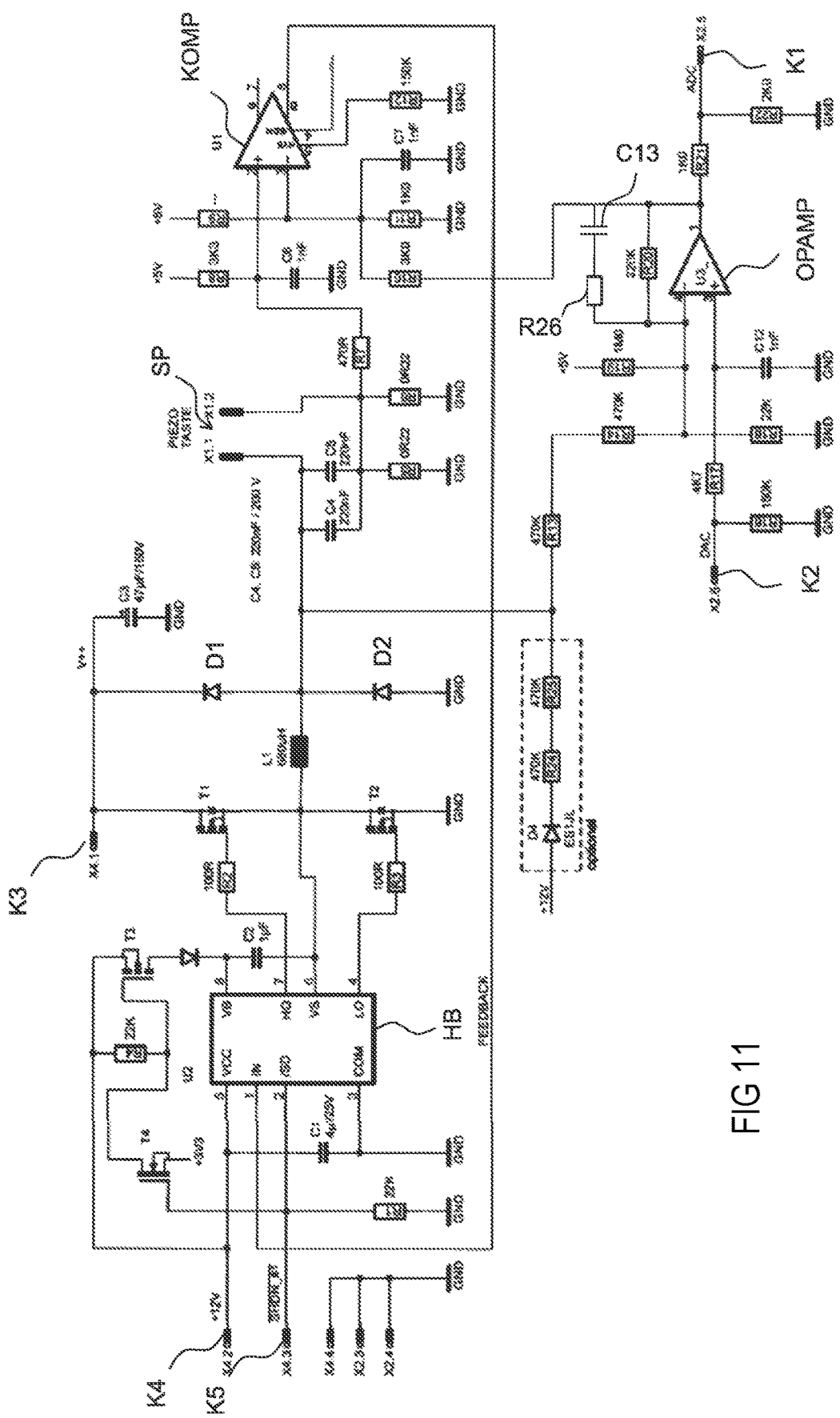
FIG. 11 shows an equivalent circuit diagram with additional circuit elements of an advantageous configuration of the driver circuit.

FIG. 11 shows, in accordance with FIG. 10, a variation of the circuit of FIG. 5 which has the resistive element R20, the resistive element R26 and the capacitive element C13 for improving control behavior and signal quality at the signal port SP.

The driver circuit, the button and the method for operating a button are not limited to the technical features and exemplary embodiments shown. The driver circuit may comprise additional electrically conductive connections and additional circuit components. In particular, the driver circuit may have additional data channels from the microcontroller to the half-bridge, in order to provide further degrees of freedom when shaping the time-dependency of the voltage signal to be transmitted at the signal port.

The invention claimed is:

1. A driver circuit comprising:
a signal port with a first terminal and a second terminal;
a first node and a second node;
a comparator with an inverting input, a non-inverting input and an output; and
an operational amplifier with an inverting input, a non-inverting input and an output, wherein the first terminal is electrically conductively connected with the inverting input of the operational amplifier, wherein the second terminal is electrically conductively connected with the non-inverting input of the comparator, wherein the inverting input of the comparator is electrically conductively connected with the output of the operational amplifier, wherein the first node is electrically conductively connected with the output of the operational amplifier, wherein the inverting input of the comparator is electrically conductively connected with the inverting input of the operational amplifier, and wherein the second node is electrically conductively connected with the non-inverting input of the operational amplifier.

2. The driver circuit according to claim 1, further comprising:
a half-bridge;
a third node, a fourth node and a fifth node;
a first transistor and a second transistor;
a first diode and a second diode; and
a capacitor,
wherein the half-bridge is electrically conductively connected with the first terminal, with the first transistor, with the second transistor, with the output of the comparator, with the fourth node and with the fifth node,
wherein the first diode is electrically conductively connected with the first terminal and the capacitor,
wherein the second diode is electrically conductively connected with the first terminal,
wherein the first transistor is electrically conductively connected with the first terminal and the third node, and
wherein the second transistor is electrically conductively connected with the first terminal and the third node.

3. The driver circuit according to claim 2, further comprising:
a microcontroller, an A/D converter, a D/A converter, a voltage converter and a piezoelectric device,
wherein the first node is electrically conductively connected with the microcontroller via the A/D converter,
wherein the second node is electrically conductively connected with the microcontroller via the D/A converter,
wherein the fourth node is electrically conductively connected with the microcontroller,
wherein the fifth node is electrically conductively connected with the microcontroller,
wherein the third node is electrically conductively connected with a supply terminal via the voltage converter, and
wherein the signal port is electrically conductively connected with the piezoelectric device.

4. The driver circuit according to claim 3,
wherein the piezoelectric device is part of a switch with haptic feedback,
wherein pressing a button is registered by analysis of a voltage present at the piezoelectric device, and
wherein a haptic feedback is generated by applying a voltage to the piezoelectric device and/or switching one or more outputs of the microcontroller.

5. The driver circuit according to claim 1, further comprising a voltage divider between the signal port and the comparator and/or a voltage divider between the signal port and the operational amplifier.

6. The driver circuit according to claim 1, wherein a voltage at the signal port is adjustable by a switching controller.

7. The driver circuit according to claim 1, wherein the comparator comprises a comparator operational amplifier without feedback.

8. The driver circuit according to claim 1, wherein the comparator comprises an adjustable hysteresis.

9. The driver circuit according to claim 1, wherein a voltage supply of the operational amplifier comprises a series regulator.

10. The driver circuit according to claim 1, further comprising a high-ohmic voltage divider configured to feed a voltage present at the signal port to the operational amplifier.

11. The driver circuit according to claim 1, wherein the signal port is controlled by the comparator via a switching controller and supplied with a predetermined voltage.

12. The driver circuit according to claim 1, further comprising a coil which is electrically conductively connected with the first terminal.

13. The driver circuit according to claim 1, wherein the signal port is activatable by triggering of one or more digital inputs of a microcontroller.

14. The driver circuit according to claim 13, wherein triggering is initiated by a touch sensor.

15. The driver circuit according to claim 1, further comprising:
a first resistive element between the inverting input of the comparator and the inverting input of the operational amplifier; and
a series interconnection with a second resistive element and a capacitive element and interconnected in parallel with the first resistive element and between the inverting input of the comparator and the inverting input of the operational amplifier.

16. A button with haptic feedback comprising:
a piezoelectric device; and
a driver circuit according to claim 1,
wherein the driver circuit is configured to:
register a change in a voltage induced by the piezoelectric device; and
apply a voltage to the piezoelectric device when the button is pressed or released.

17. A method for operating a button with haptic feedback, the method comprising:
registering a change in a voltage induced by a piezoelectric device; and
activating the piezoelectric device by applying a voltage induced by a driver circuit according to claim 1, the driver circuit being a driver circuit of the piezoelectric device.

18. The method according to claim 17, wherein some energy is recovered on activation.

19. The method according to claim 17, wherein registering the change in the voltage includes analyzing a change in the voltage over time at an electrical device.

20. The method according to claim 17, further comprising:
initializing the driver circuit by a microcontroller thereby ascertaining:
whether a component is connected to the signal port,
a magnitude of a capacitance of a circuit component connected to the signal port, and/or
a magnitude of a resonant frequency of a circuit component connected to the signal port.

* * * * *